United States Patent [19]

Wang et al.

[11] Patent Number: 5,449,627
[45] Date of Patent: Sep. 12, 1995

[54] LATERAL BIPOLAR TRANSISTOR AND FET COMPATIBLE PROCESS FOR MAKING IT

[75] Inventors: Ying-Tzung Wang; Sheng-Hsing Yang, both of Hsinchu, Taiwan

[73] Assignee: United Microelectronics Corporation, Hsinchu, Taiwan

[21] Appl. No.: 355,478

[22] Filed: Dec. 14, 1994

[51] Int. Cl.[6] ........................................ H01L 21/8248
[52] U.S. Cl. ........................... 437/31; 437/32; 437/34; 437/162; 437/59; 148/DIG. 9
[58] Field of Search .................. 437/31, 32, 34, 59, 437/162, 917; 148/DIG. 9, DIG. 96

[56] References Cited

U.S. PATENT DOCUMENTS

| | | | |
|---|---|---|---|
| 4,743,565 | 5/1988 | Goth et al. | 437/32 |
| 4,778,774 | 10/1988 | Blossfeld | 437/32 |
| 4,868,135 | 9/1989 | Ogura et al. | 437/34 |
| 5,006,476 | 4/1991 | De Jong et al. | 437/32 |
| 5,075,241 | 12/1991 | Spratt et al. | 437/59 |
| 5,079,182 | 1/1992 | Ilderem et al. | 437/34 |
| 5,187,109 | 2/1993 | Cook et al. | 437/32 |
| 5,389,553 | 2/1995 | Grubisich et al. | 437/31 |

*Primary Examiner*—Tuan H. Nguyen
*Attorney, Agent, or Firm*—George O. Saile

[57] ABSTRACT

A lateral bipolar transistor and method of making the transistor are disclosed. The device is made by etching a trench around a central region of a semiconductor body. An emitter is buried beneath the surface of this central area and contact to it is made via a self-alignment technique. The collector region of the transistor is contacted through the floor of the trench while the base region of the transistor is contacted in a region that surrounds the trench. The described method is compatible with the simultaneous manufacture of FET devices on the same chip.

10 Claims, 8 Drawing Sheets

LATERAL BIPOLAR TRANSISTOR AND FET COMPATIBLE PROCESS FOR MAKING IT

BACKGROUND OF THE INVENTION

1. Field of the Invention

The present invention relates to a bipolar lateral transistor and method of fabricating it, more particularly to a method that allows the simultaneous fabrication of FET (Field Effect Transistor) devices.

2. Description of the Prior Art

Aside from improvements in material quality, improved performance of transistors, both bipolar and field effect, has been achieved by successful reduction of the dimensions of the various subregions that, together, constitute a transistor. Examples of parameters that need to be minimized in order to optimize device performance are emitter-base and collector-base capacitances. These parameters decrease as emitter and collector area, respectively, are reduced in size. Similarly, switching speed increases as the base width (emitter-to-collector distance) is decreased.

Reductions in the dimensions of the various subregions of transistor devices were effected by means of improved photoresist and associated techniques, such as, for example, etching methods. As the limits of what could be achieved by these techniques approached, other ways of bringing about these reductions had to be found.

One such approach to the problem of device size reduction has been the lateral transistor. In conventional, or planar, transistors incorporated as part of integrated circuits, the emitter dimensions (for example) are limited by what can be achieved by masking and etching a planar surface. Thus, if the emitter is to take the shape of a rectangle, its lesser dimension (or line width) is, for planar technology, limited by the state of the masking and etching art—presently about 0.5 microns.

The lateral transistor geometry derives from the fact that the thickness of a layer, be it a diffusion region or a deposited film, can be controlled to much tighter tolerances than can line width, as discussed above. Typically, layer thicknesses can be controlled to better than 0.01 microns. This fact is utilized in lateral transistor design by, in effect, making cross-sections of one or more layers and then using the resulting exposed regions to define the various subareas of the device.

In order to achieve this cross-sectioning effect, processes for making lateral transistors have centered around providing a pedestal, or mesa, that protrudes above the surrounding surface of the integrated circuit, the actual transistor being now in part constructed along the vertical edges of said pedestal. An example of the use of such a structure to create a lateral transistor can be seen in U.S. Pat. No. 4,743,565, May 10, 1988, by G. R. Goth and S. D. Malaviya. A similar structure, also employing a mesa, has been described by Cook and Pelella in U.S. Pat. No. 5,187,109, February 1993.

A disadvantage of both these examples of lateral transistors is that a major portion of the device is higher than the plane of the surrounding integrated circuit. This makes it difficult to achieve full planarization of the total surface, leading in turn to difficulties in any subsequent alignment and registration steps that have yet to be performed to complete the manufacture of the integrated circuit, for example the provision of inter-device wiring.

SUMMARY OF THE INVENTION

It is an object of the present invention to provide an improved lateral transistor.

A further object of the invention is to provide a process for manufacturing a bipolar transistor which allows for the simultaneous manufacture of FET devices on the same chip.

It is yet a further object of the invention to provide a lateral transistor which simplifies, rather than complicates, subsequent planarization steps in the manufacturing process.

BRIEF DESCRIPTION OF THE DRAWINGS

FIGS. 1A through 7A show cross-sectional views of a semiconductor structure, illustrating the results of the various steps of a method of making a lateral bipolar transistor in accordance with the present invention, while FIGS. 1B through 7B illustrate the results of the same steps on the making of a field effect transistor.

The drawings are not to scale.

DESCRIPTION OF THE PREFERRED EMBODIMENTS

Figure 6A:
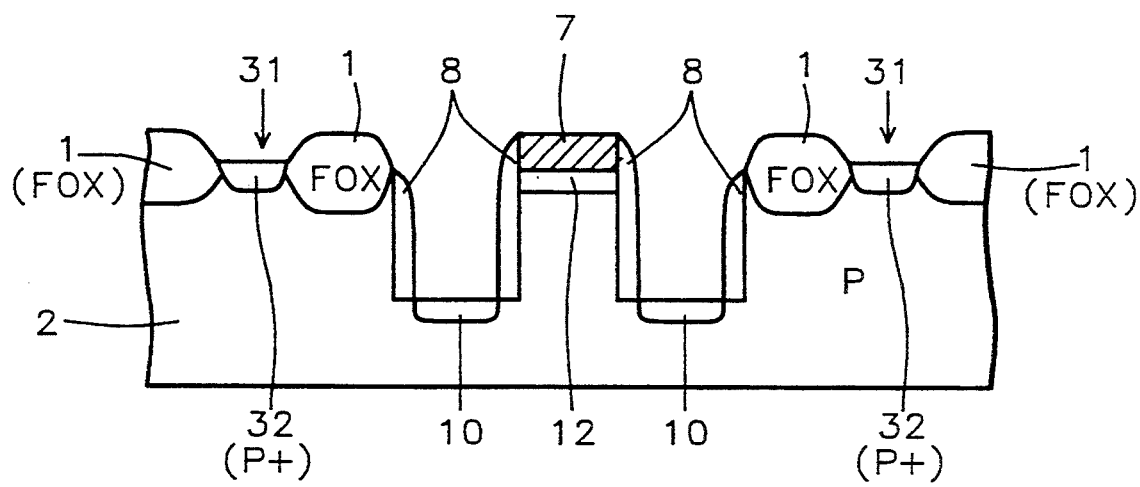
Figure 7A:
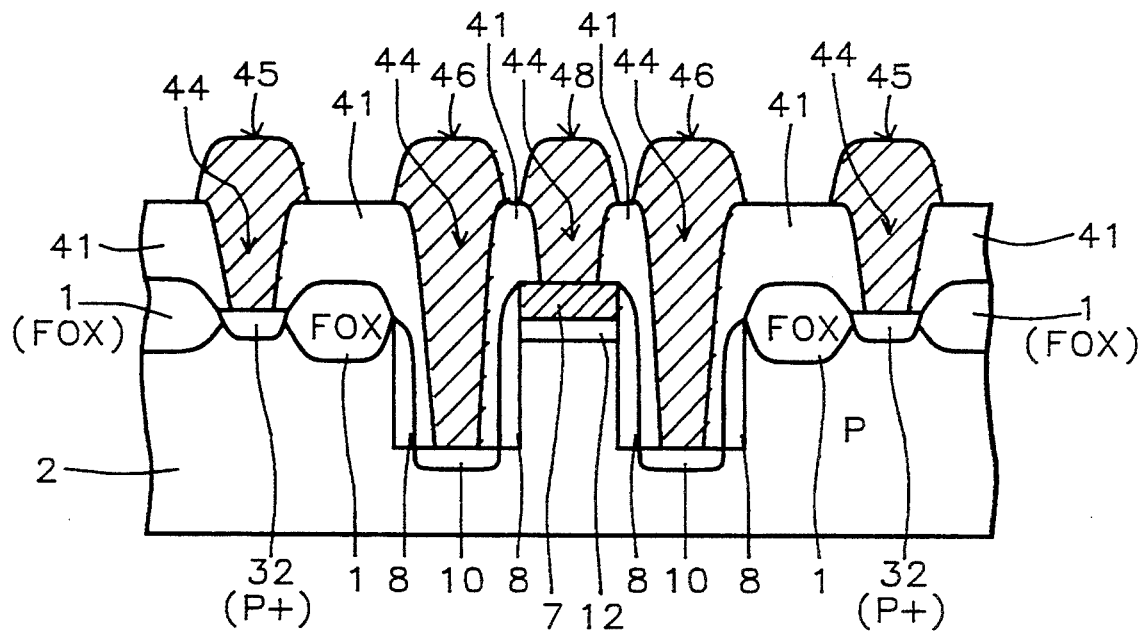

The structure of the bipolar lateral transistor that is the subject of this disclosure is fully illustrated in FIGS. 6A and 7A, but it will be more easily understood by a prior review of the process for its manufacture. In particular, since the technology of choice for most of today's integrated circuits is FET based, bipolar devices find their most widespread application as special purpose devices within integrated circuits that are built primarily from FET devices. Examples of such special purpose applications include current detectors and off-chip drivers.

Thus, when developing a process for the manufacture of a bipolar transistor, it is important that such a process be capable of producing FET devices at the same time as the bipolars with a minimum of process steps that contribute to the generation of only one of the two device types. Such a process has been developed and will now be described. Each of the process steps will be discussed with respect to both the bipolar device that constitutes the present invention and a portion of an FET circuit on an adjacent area in the same chip.

Figure 1A:
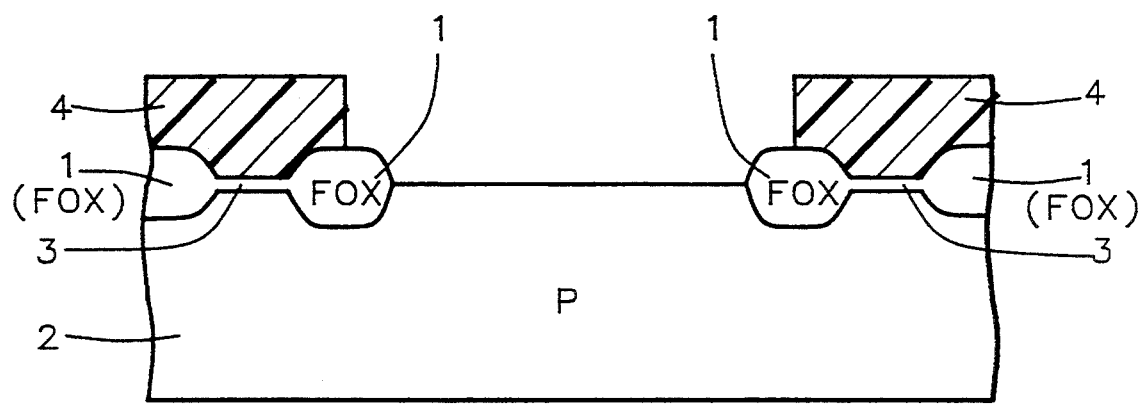
Figure 1B:
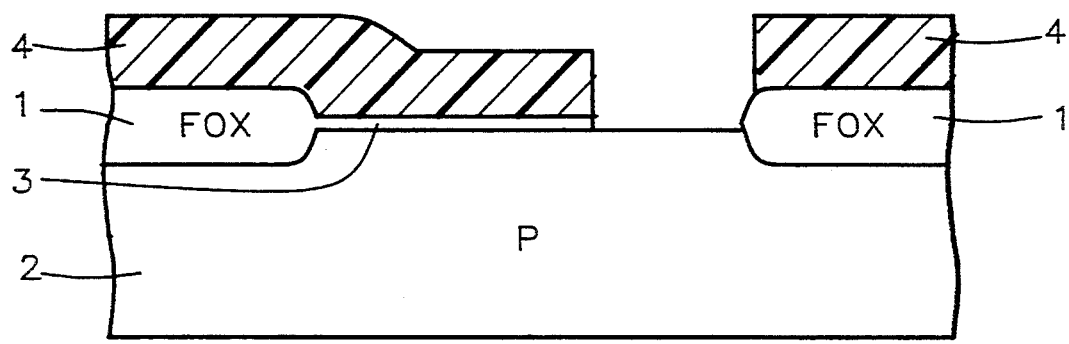

Referring now to FIGS. 1A and 1B, schematic cross-sections at the surface of a typical integrated circuit in its early stages are shown. In both cases the body of the semiconductor is of P type conductivity and is covered by a thin layer of gate oxide 3. FIG. 1A shows the starting point for the bipolar transistor region. It has been processed to the point of providing three regions, separated from one another by areas 1 of FOX (field oxide). The central area is left unprotected while the outlying regions, including part of the FOX 1 and gate oxide 3, are covered by a layer of photoresist 4 so that the exposed gate oxide is readily removed by etching, as shown.

Similarly, as illustrated in FIG. 1B, the surface has been coated with a first layer of photoresist 4 so that a portion of gate oxide 3 could be etched away. In this (the FET) case, however, gate oxide continues to cover about two thirds of the area between the two regions of FOX 1, the cleared area being asymmetrically located to one side. Prior to stripping away photoresist layer 4, etching is allowed to proceed for longer than would be necessary to only just remove the layer of gate oxide 3 (overetching).

Figure 2A:
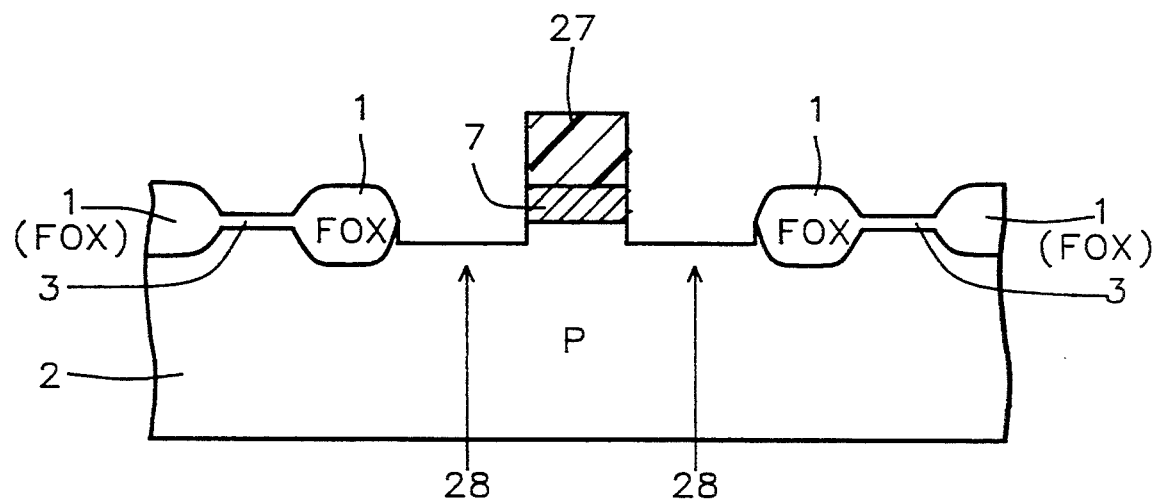
Figure 2B:
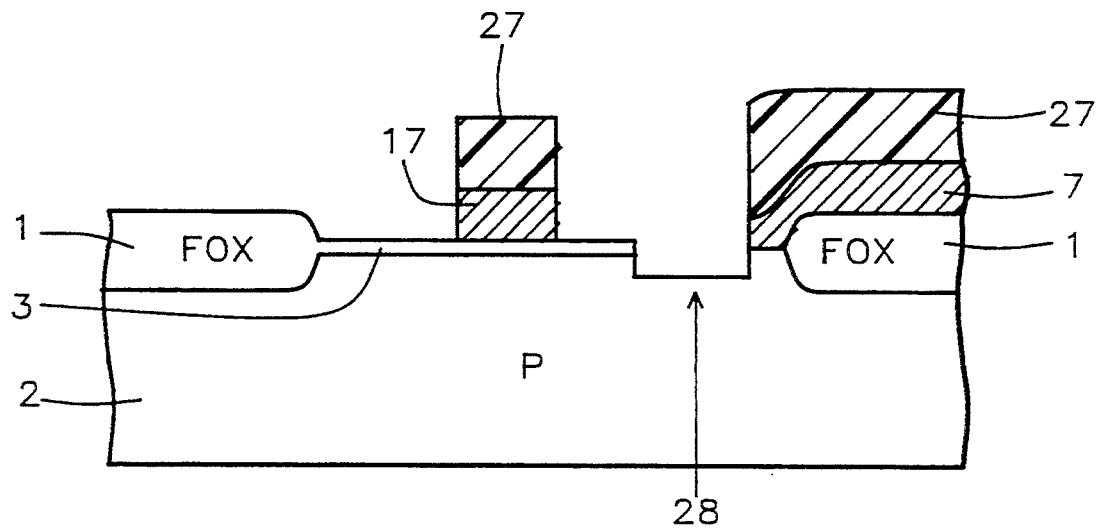

Central area 2 (in FIG. 1A) is now covered with a first layer of polycrystalline silicon deposited by means of chemical vapor deposition (CVD) to a thickness between 0.2 and 0.4 microns. This is followed by an ion implantation step such that said polycrystalline silicon (designated 7 in FIG. 2A and and 17 in FIG. 2B) is now doped so as to be N+ (strongly N type). A second photoresist mask 27 is now applied and layer 7 is etched away everywhere except where protected by 27. The appearance of the bipolar and FET areas is now as shown in FIGS. 2A and 2B respectively. Note that Shallow trenches 28 have been created as a result of the aforementioned overetching.

Figure 3A:
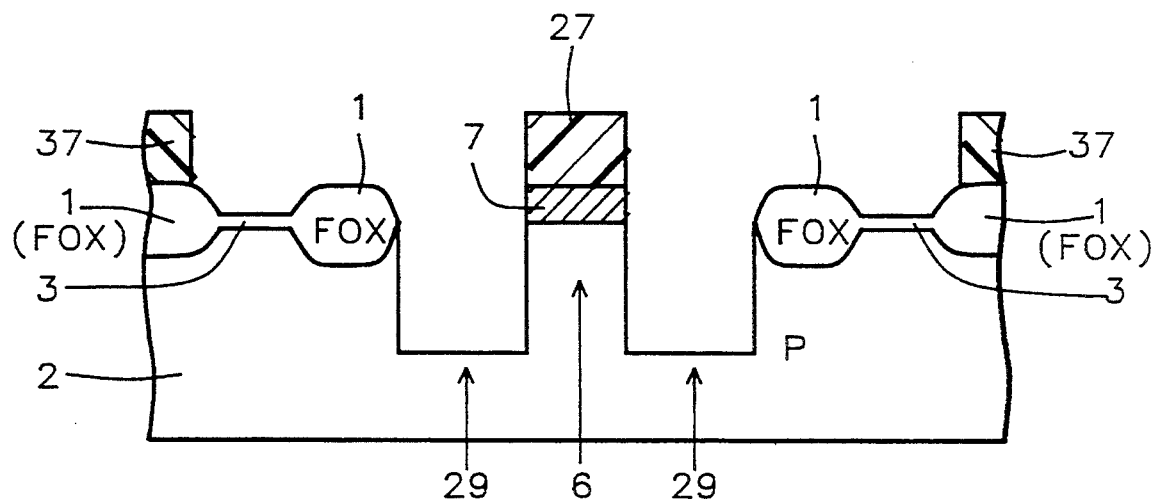
Figure 3B:
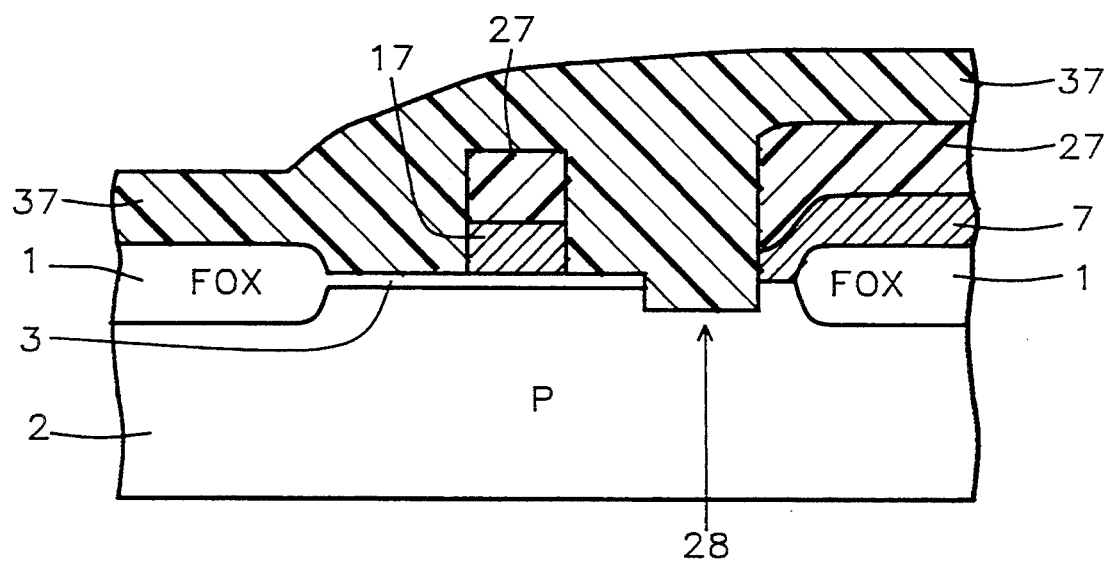

Referring now to FIG. 3B, a third layer of photoresist 37 is now applied and processed so as to cover only the FET region. The entire structure is now subjected to a silicon anisotropic etch, typically reactive ion etching (RIE) in chlorine gas, thereby creating deep trench 29 in the bipolar region only, as shown in FIG. 3A. Creation of trench 29 results in the emergence of pedestal 6. Note that overetching is also necessary at this stage so as to ensure that all side walls are completely free of any residual material.

Figure 4A:
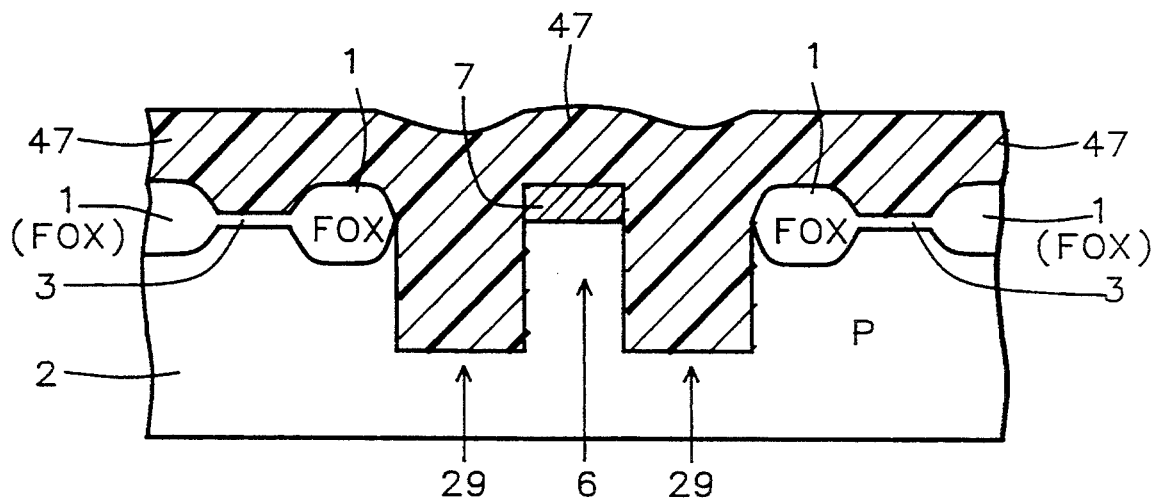
Figure 4B:
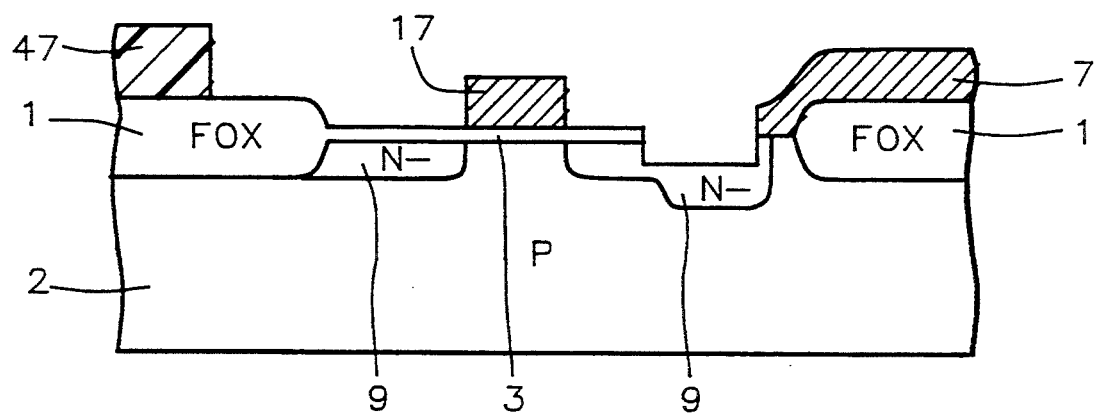

Photoresist layers 27 and 37 are now stripped away and a fourth layer of photoresist 47 is applied to the bipolar regions only, as illustrated in FIG. 4A. The entire structure is now subjected to a low dosage ion implant of N type dopant, such as phosphorus. This does not affect the bipolar side (since it is protected by photoresist layer 47) but, on the FET side, areas of N− type silicon 9 are created.

Figure 5A:
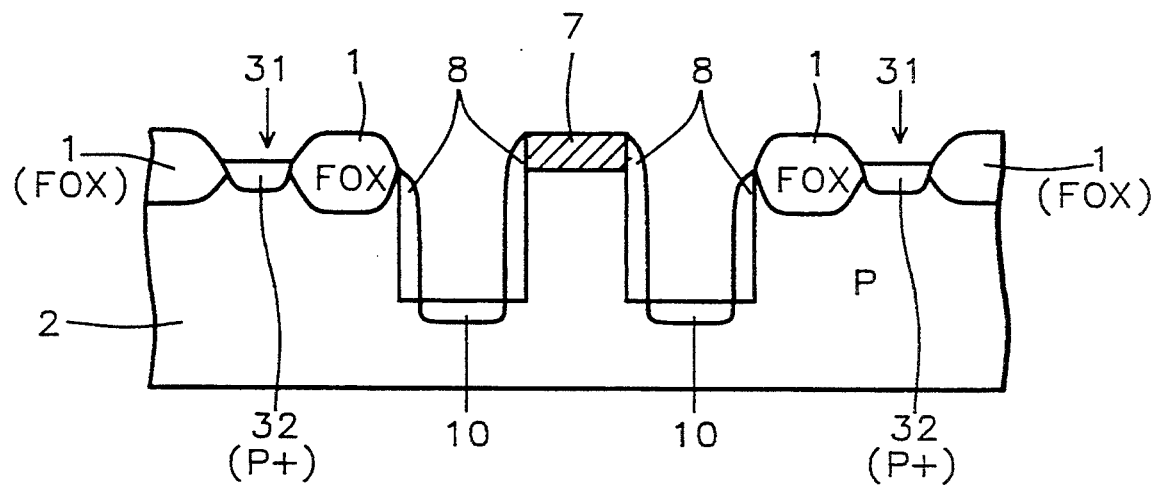
Figure 5B:
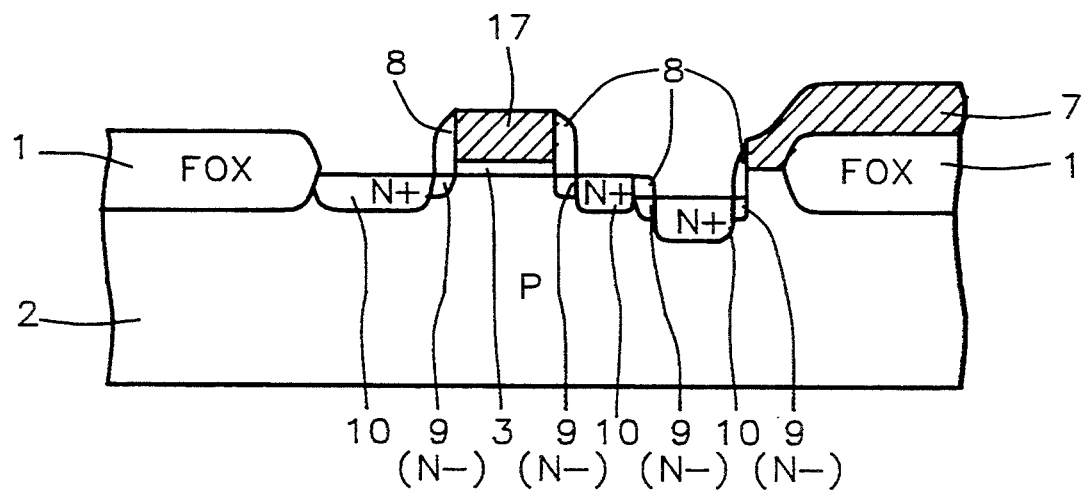

CVD SiO$_2$ is now deposited over the entire structure to a thickness of between 0.2 and 0.4 microns. The structure is then subjected to an anisotropic etch such that the deposited oxide is removed from the bottom of the trench but not from the sidewalls, including the sidewalls of the pedestal 6. This oxide, left on the sidewalls, serves as spacers 8 (see FIGS. 5A and 5B) to prevent the sidewall surfaces from becoming N+ doped during the next step wherein suitable masking and ion implantation techniques are used to create N+ regions 10 as shown in FIGS. 5A and 5B. Note that the original N− regions 9 are still present in FIG. 5B but have been largely incorporated into regions 10 by virtue of the additional N type dopant that they received.

Following the N+ implantation, fresh photoresist masks are applied to protect the entire structure except in the regions designated as 31 in FIG. 5A. The layer of gate oxide there is etched away and the structure is subjected to high dosage implantation of boron ions, thus creating the P+ regions marked as 32 in FIG. 5A.

Figure 6B:
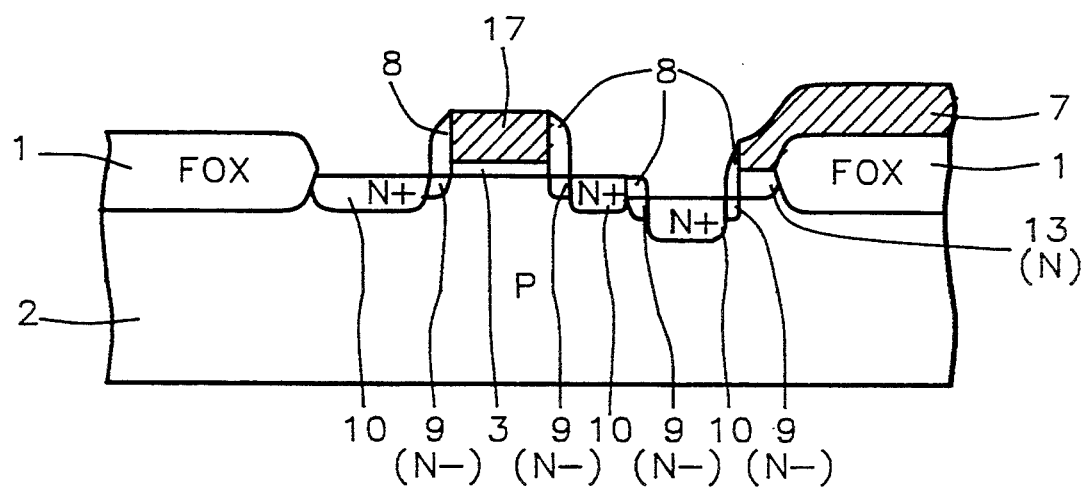

The entire structure is now subjected to a thermal drive-in treatment for 20 to 40 minutes at between 850° C. and 950° C. This serves to drive N type dopant atoms from the heavily N doped polycrystalline silicon regions 7 in FIGS. 6A and 6B into the single crystalline P type body, thereby creating a buried emitter 12 in FIG. 6A and a buried region 13 (in FIG. 6B) that could be used as a connector between, for example, the bipolar and the FET regions.

Figure 7B:
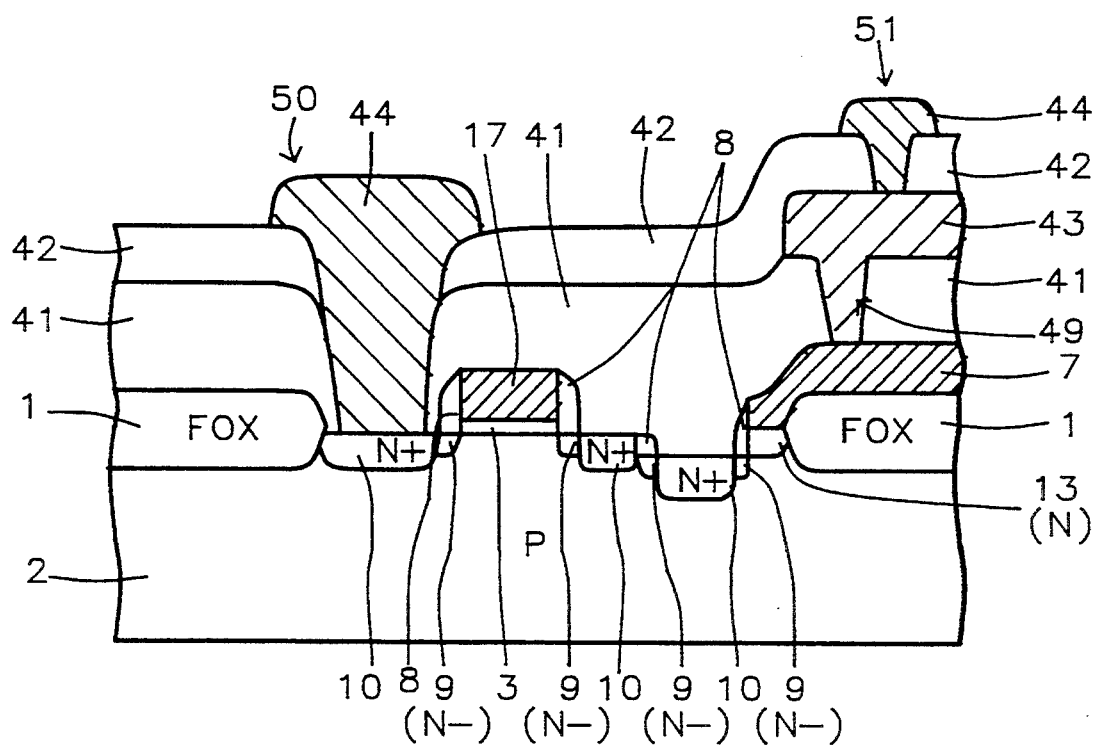

Finally, a passivation layer of insulation 41 is deposited over the entire structure, as illustrated in FIGS. 7A and 7B. On the FET side only, via holes such as 49 in FIG. 7B are etched so as to allow contact with first polycrystalline layer 7 by a second polycrystalline layer 43, previously deposited by CVD to a thickness of between 0.2 micron and 0.4 micron. Additional insulation 42 is then deposited to protect layer 43. Layer 42 is not explicitly shown in FIG. 7A, being indistinguishable from layer 41. Via holes are now etched in the insulation and metallic layer 44 is deposited so as to make contact with the various regions that are made accessible as a result of creating said via holes.

Figure 8:
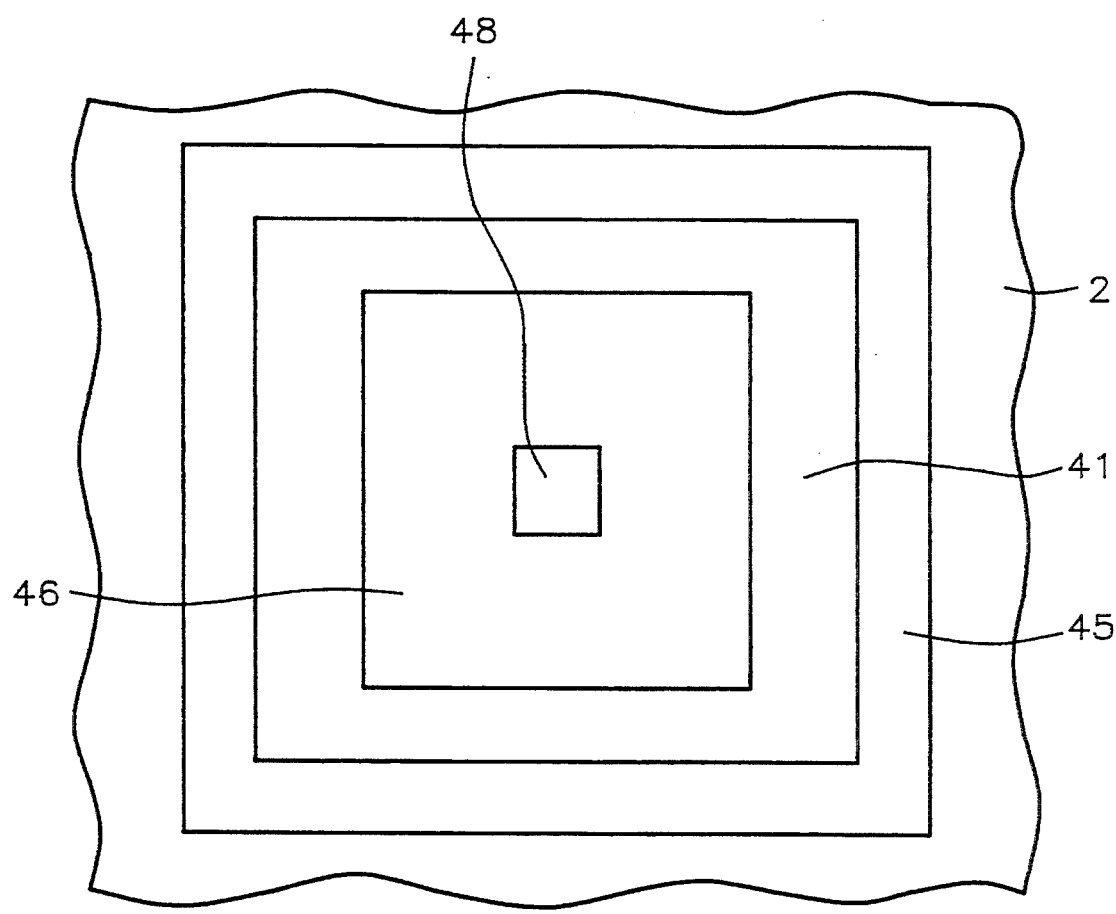
FIG. 8 is a plan view of the structure whose cross-sectional view is shown in FIG. 7A.

On the bipolar side (FIG. 7A) the base contact of the lateral transistor that is the subject of this disclosure has been tagged as 45, the collector as 46, and the emitter contact as 48. A plan view of the lateral transistor is presented in FIG. 8. On the FET side (FIG. 7B) the processing has led to the creation of an FET whose source contact has been tagged as 50 while the drain contact is tagged as 51. Note that contact to the gate 17 is not made through a via hole. Instead, the polycrystalline silicon layer from which 17 was formed is shaped so as to extend in a direction perpendicular to the plane of FIG. 7B, thereby serving as a buried connector.

While the invention has been particularly shown and described with reference to the preferred embodiments thereof, it will be understood by those skilled in the art that various changes in form and details may be made without departing from the spirit and scope of the invention.

What is claimed is:

1. A process for simultaneously forming a lateral bipolar NPN transistor and a field effect transistor, comprising the steps of:

providing a body of P-type silicon;

designating an area intended for the formation of a bipolar transistor and an area intended for the formation of a field effect transistor on the surface of said silicon body, said areas being separated by a layer of field oxide;

providing a layer of gate insulation composed of silicon oxide on the surface of said silicon body;

removing said layer of gate insulation in its entirety in said bipolar area and partially in said field effect area;

depositing a first layer of strongly N type polycrystalline silicon onto the surface of said silicon body and then selectively etching it so as to leave smaller areas of polycrystalline silicon, centrally located within said bipolar and field effect areas and positioned so as to lie over said layer of gate insulation in said field effect area;

selectively covering the field effect area in its entirety and said smaller area of polycrystalline silicon in the bipolar area with first layer of photoresist and then anistropically etching said silicon body, thereby creating, in the bipolar area, a pedestal surrounded by a trench;

stripping away all of said first layer of photoresist, covering only the bipolar area with a second layer of photoresist and then bombarding said silicon body with N type dopant ions;

stripping away all of said second layer of photoresist, depositing a layer of silicon oxide onto the sidewalls of said pedestal and said trench in the bipolar area as well as onto all vertical surfaces in the field effect area;

protecting the surface of said silicon body with a third layer of photoresist, patterned to leave uncovered the floor of the trench in said bipolar area and covering all of the field effect area except for said smaller area of polycrystalline silicon, and bombarding said silicon body with N type dopant ions;

stripping away all of said third layer of photoresist, protecting the surface of said silicon body with a fourth layer of photoresist, patterned to leave uncovered an area of silicon surface surrounding the trench in said bipolar area, and bombarding said silicon body with boron ions, and stripping away all of said fourth layer of photoresist;

heating said silicon body so as to cause the diffusion of N type dopant ions from said first layer of polycrystalline silicon into said silicon body thereby creating a buried emitter in the bipolar area and a buried conductor in the field effect area.

2. The process of claim 1 further comprising:

depositing a layer of passivation insulation onto the surface of said silicon body;

etching via holes through said layer of passivation insulation so as to uncover areas that need to be electrically contacted;

depositing a second layer of polycrystalline silicon in only the field effect area;

depositing a layer of conductive material in both the bipolar and the field effect areas; and etching said second layer of polycrystalline silicon and said layer of conductive material into patterns, thereby creating an electrical circuit.

3. The process of claim 1 wherein said N type dopant ions comprise arsenic or phosphorus.

4. The process of claim 1 wherein said first layer of polycrystalline silicon are deposited by chemical vapor deposition.

5. The process of claim 1 wherein the layer of silicon oxide is deposited onto the sidewalls by a process further comprising:

depositing silicon oxide onto the surface of said silicon body; and anisotropically etching said layer of silicon oxide, in the vertical direction only, as far as the oxide-silicon interface.

6. The process of claim 5 wherein the thickness of said deposited layer of silicon oxide is between 0.2 and 0.4 microns.

7. The process of claim 1 wherein said heating of said silicon body is at a temperature between 850° and 950° C. for between 20 to 40 minutes.

8. The process of claim 1 further comprising the step of using said buried conductor to provide electrical contact between the bipolar and the field effect areas.

9. The process of claim 8 wherein said buried conductor is used to provide electrical contact between the the field effect area and said buried emitter in the bipolar area.

10. The process of claim 1 wherein the thickness of said first layer of polycrystalline silicon is between 0.2 and 0.4 microns.

* * * * *